US006183615B1

United States Patent
Yasar et al.

(12) United States Patent
(10) Patent No.: US 6,183,615 B1
(45) Date of Patent: Feb. 6, 2001

(54) TRANSPORT SYSTEM FOR WAFER PROCESSING LINE

(75) Inventors: Tugrul Yasar, West Hurley; Rodney Lee Robison, Kingston; Daniel Deyo, Phoenicia, all of NY (US); Marian Zielinski, Washington Township, NJ (US)

(73) Assignee: Tokyo Electron Limited, Tokyo (JP)

( * ) Notice: Under 35 U.S.C. 154(b), the term of this patent shall be extended for 0 days.

(21) Appl. No.: 08/390,226

(22) Filed: Feb. 17, 1995

Related U.S. Application Data

(63) Continuation of application No. 07/905,016, filed on Jun. 26, 1992, now abandoned.

(51) Int. Cl.⁷ .................................................. C23C 14/34
(52) U.S. Cl. ............................. 204/298.26; 204/192.12; 204/298.23
(58) Field of Search .................... 204/192.12, 298.15, 204/298.23, 298.25, 298.26, 298.28; 414/217, 222

(56) References Cited

U.S. PATENT DOCUMENTS

| | | |
|---|---|---|
| 3,294,670 | 12/1966 | Charschan et al. . |
| 3,521,765 | 7/1970 | Kauffman et al. . |
| 3,584,847 | 6/1971 | Hammond, Jr. et al. . |
| 3,680,489 | 8/1972 | English . |
| 3,775,285 | 11/1973 | Lane . |
| 3,779,885 | 12/1973 | Labedan et al. . |
| 3,785,853 | 1/1974 | Kirkman et al. . |
| 3,787,312 | 1/1974 | Wagner et al. . |
| 3,832,610 | 8/1974 | Shimizu et al. . |
| 3,912,991 | 10/1975 | Moyse . |
| 3,968,018 | 7/1976 | Lane et al. . |
| 4,013,532 | 3/1977 | Cormia et al. . |
| 4,042,128 | 8/1977 | Shrader . |
| 4,116,806 | 9/1978 | Love et al. . |
| 4,166,563 | 9/1979 | Peyraud et al. . |
| 4,184,448 | 1/1980 | Aichert et al. . |
| 4,284,033 | 8/1981 | del Rio . |
| 4,405,435 | 9/1983 | Tateishi et al. . |

(List continued on next page.)

FOREIGN PATENT DOCUMENTS

| | | |
|---|---|---|
| 3805380 | 8/1989 | (DE) . |
| 2602798 | 2/1988 | (FR) . |
| 2095704 | 3/1981 | (GB) . |
| 2135700 | 9/1984 | (GB) . |
| 0052149 | 3/1982 | (JP) . |
| 0018305 | 1/1986 | (JP) . |
| 1240647 | 10/1986 | (JP) . |

\* cited by examiner

*Primary Examiner*—Nam Nguyen
(74) *Attorney, Agent, or Firm*—Wood, Herron & Evans, L.L.P.

(57) ABSTRACT

A wafer processing system includes a plurality of evacuable housings connected in series to form a processing line, with a plurality isolation valves to separately isolate the housings. A track extends through the connected housings. At least one wafer carrier is moveable on the track, through the housings and along the processing line. The wafer carrier holds wafers in vertical orientation and also includes a plurality of magnets aligned along its bottom. Outside the housings, a plurality of magnetic drive units are aligned parallel with the track, with one drive unit per housing. Each drive unit includes a motor driven conveyor with a plurality of magnets mounted thereon which imposes magnetic fields inside the housing to magnetically couple with the magnets mounted on the carrier. When the motor driven conveyor moves the imposed magnetic fields, the magnetic coupling causes the wafer carrier to move. A controller operatively connected to the isolation valves and the drive units coordinates movement of wafer carriers along the processing line according to a predetermined sequence while maintaining vacuum conditions in the housings.

23 Claims, 5 Drawing Sheets

U.S. PATENT DOCUMENTS

| | | |
|---|---|---|
| 4,426,267 | 1/1984 | Munz et al. . |
| 4,492,180 | 1/1985 | Martin . |
| 4,498,832 | 2/1985 | Corville . |
| 4,518,078 | 5/1985 | Garrett . |
| 4,526,643 * | 7/1985 | Okano et al. ............... 204/298.37 X |
| 4,533,069 | 8/1985 | Purser . |
| 4,540,326 | 9/1985 | Southworth et al. . |
| 4,544,468 | 10/1985 | Munz et al. . |
| 4,548,698 | 10/1985 | Sellschopp . |
| 4,548,699 | 10/1985 | Hutchinson et al. . |
| 4,558,388 | 12/1985 | Graves, Jr. . |
| 4,576,828 | 3/1986 | Walker, Jr. . |
| 4,584,045 | 4/1986 | Richards . |
| 4,619,573 | 10/1986 | Rathmann et al. . |
| 4,624,617 | 11/1986 | Belna . |
| 4,626,336 | 12/1986 | Bloomquist et al. . |
| 4,650,064 | 3/1987 | Slabaugh . |
| 4,663,009 | 5/1987 | Bloomquist et al. . |
| 4,664,578 | 5/1987 | Kakehi . |
| 4,675,096 | 6/1987 | Tateishi et al. . |
| 4,693,777 | 9/1987 | Hazano et al. . |
| 4,699,554 | 10/1987 | Kawashima et al. . |
| 4,701,251 | 10/1987 | Beardow . |
| 4,733,631 | 3/1988 | Boyarsky et al. . |
| 4,749,465 | 6/1988 | Flint et al. . |
| 4,765,273 | 8/1988 | Anderle . |
| 4,766,993 | 8/1988 | Kita et al. . |
| 4,790,921 | 12/1988 | Bloomquist et al. . |
| 4,793,911 | 12/1988 | Kemmerer et al. . |
| 4,800,818 | 1/1989 | Kawaguchi et al. . |
| 4,805,761 | 2/1989 | Totsch . |
| 4,812,217 | 3/1989 | George et al. . |
| 4,824,545 | 4/1989 | Arnold et al. . |
| 4,825,808 | 5/1989 | Takahashi et al. . |
| 4,828,668 | 5/1989 | Yamazaki et al. . |
| 4,834,855 | 5/1989 | Bloomquiest et al. . |
| 4,858,558 | 8/1989 | Ohmura et al. . |
| 4,865,713 | 9/1989 | Kohlhase et al. . |
| 4,869,802 | 9/1989 | Wirz et al. . |
| 4,871,434 | 10/1989 | Munz et al. . |
| 4,877,123 | 10/1989 | Fukuwatari et al. . |
| 4,877,505 | 10/1989 | Bergmann . |
| 4,886,592 | 12/1989 | Anderle et al. . |
| 5,110,249 | 5/1992 | Norman . |

TRANSPORT SYSTEM FOR WAFER PROCESSING LINE

This application is a continuation of application Ser. No. 07/905,016 filed Jun. 26, 1992, abandoned.

FIELD OF THE INVENTION

This invention relates to a transport system for a wafer processing line. More particularly, this invention relates to a transport system which includes one or more linear magnetic drive units for translating a wafer carrier along a processing line.

BACKGROUND OF THE INVENTION

Semiconductor wafer manufacture generally requires the performance of a plurality of processing steps according to a predetermined sequence under vacuum conditions. In one type of wafer processing system, evacuatable modules or housings connect serially, and each housing serves as the site for performing one of the processing steps, such as heating or sputter coating, or simply to initially isolate wafers from the outside environment. Wafer processing systems which utilize a plurality of serially-connected housings are commonly referred to as "in-line" processing systems. Generally, these "in-line" systems allow maximum wafer throughput per unit time.

For in-line wafer processing systems where processes such as sputtering, vacuum evaporation, plasma etching are performed, it is necessary to move some parts such as substrates and shutters. Motion of these parts in vacuum is usually accomplished by using vacuum feedthroughs of various kinds. A feedthrough penetrates the walls of the vacuum system to provide a physical connection such as a shaft between the atmospheric side and the vacuum side. These feedthrough connections have seals to prevent leaks from the atmosphere into the vacuum.

Usually a rotary feedthrough is used to transmit rotational motion into vacuum. Rotation is then converted to linear motion by means of mechanical components such as a ball screw, rack and pinion, worm gear, nuts, etc. which depend on friction to operate.

In many applications the cleanliness of the vacuum process system is critical. Mechanical devises that depend upon frictional forces to provide linear motion generate particles and contamination. This makes these devices unsuitable for applications where extreme cleanliness and particulate free operation is required.

It is an objective of this invention to transport wafers along a wafer processing line under vacuum conditions with a minimum risk of contamination form particulate.

It is another objective of this invention to maximize wafer throughput for an in-line processing system and to minimize wafer handling which presents a risk of contamination.

This invention meets the above-stated objectives by utilizing magnetic coupling between drive units located outside a wafer processing line and wafer carriers located inside the processing line to drive the carriers on a track through serially connected, evacuatable housings.

Each wafer carrier includes wheels which roll along a track formed by the serially connected housings. Each wafer carrier also holds a plurality of magnets along substantially its entire length, parallel with the track. The magnets are preferably arranged so as to be located proximate a side or bottom wall of the housing when the carrier is mounted on the track.

On an opposite side of this wall, each magnetic drive unit also includes a plurality of magnets aligned parallel with the track. The magnets are mounted on an endless belt conveyer with a length slightly less than the respective housing. Magnets carried by the conveyor impose a plurality of magnetic fields within the housing. Operation of the conveyor moves the imposed magnetic fields in a linear direction along the track within the housing. Magnetic coupling between the moving, imposed magnetic fields and the magnets held by the carrier causes the carrier to translate linearly through the housing along the track.

Each wafer carrier includes at least one planar member or pallet which is oriented vertically, with wafers mounted in vertical orientation on the pallet. Preferably, two parallel pallets are provided, with wafers mounted to the outer surfaces of the two pallets. The housings include wafer processing units located on opposite sides of the track, so that wafers mounted to the outer surfaces of the pallets on opposite sides of the carrier may be processed simultaneously. Processing of wafers while they are oriented vertically, rather than horizontally, minimizes the risk of contamination due to the settling of particulate matter.

The wafer processing devices are mounted within, or integrally formed with the housings, so that each housing defines a wafer processing station along the processing line. Operations which may be performed at the stations include sputtering, sputter etching, heating, degassing, chemical vapor deposition, plasma assisted chemical vapor deposition or any other wafer processing step necessary to manufacture of semiconductor wafers. Depending upon the necessary processing steps, wafer processing lines may include as few as two serially connected housings, or up to ten or more serially connected housings.

Another aspect of the invention relates to rotation of the planar wafer holding pallets during processing. This rotation occurs via rotational magnetic drive units which are also located outside of one or more of the housings. This enables the wafers to be moved relative to a processing apparatus, such as a target for cathode sputtering, without requiring any feedthrough or frictional engagement of mechanical devices.

According to a preferred embodiment of the invention, a linear transport system for a wafer processing line includes a plurality of magnetic drive units, each magnetic drive unit associated with an evacuatable housing which forms one processing station along a wafer processing line defined by a plurality of serially connected housings. A track extends through the interconnected housings. At least one wafer carrier is movable along the track and holds magnets arranged substantially parallel with the track and proximate to a nonmagnetic wall of the housings. Each magnetic drive unit includes an endless belt conveyor with a plurality of magnets mounted thereon and arranged parallel with the track, but located outside of the respective housing. Magnetic coupling between magnetic fields imposed in the housing by the magnets on the belt driven conveyor and the magnets on the wafer carrier moves the wafers through the housing. Each conveyor is driven by a motor, which is operated by a motor controller.

Each housing has an evacuation pump connected thereto via a gate valve. The housings are separated by isolation valves. Each one of the pumps, the gate valves and the isolation valves is operated by an associated motor and motor controller. One magnetic drive unit is associated with each of the housings. Each magnetic drive unit includes a motor which is operated by a motor controller. A programmable computer controller is operatively connected to the motor controllers of the magnetic drive units, the isolation valves, the gate valves and the pumps to control wafer transport and pumping operations along the processing line according to a desired sequence.

Preferably, each wafer carrier includes a magnet mounted on the vertical, wafer-holding pallet. This magnet couples with a magnetic field created in the housing by a magnetic rotational drive unit located outside of the housing. Rotation of the magnetic drive units rotates the imposed field, thereby rotating the pallet and moving the wafers with respect to the wafer processing units. Rotating the pallet during processing assures uniformity of treatment for the wafers. The magnetic rotational drive unit preferably connects to the housing and is laterally movable toward and away from the housing to control the imposition of the magnetic field.

Compared to prior wafer processing systems, this wafer processing system is simple, clean and results in reduced particulate generation from frictional mechanical components. For example, silicone wafer processing equipment for LSI and ULSI applications requires a cleanliness level of less than 0.01 to 0.30 micrometers or larger size particles per cm2 of substrate surface. In such an application, a sputtering system is used for aluminum metallization. Because this process is particularly sensitive to particles generated from frictional forces, the system used cannot employ internal mechanical components which generate particles due to frictional forces.

Another advantage of this invention relates to the ease of maintenance. All of the major drive mechanisms associated with this wafer processing line are located outside of the housings and can be easily reached for service, repair or replacement without breaking the vacuum or requiring entry into any of the separate processing stations or housings. This increases the up time of the equipment and decreases the time associated with service, repair and replacement. The net result is an overall increase in productivity for the wafer processing line.

These and other features of the invention will be more readily understood in view of the following detailed description and the drawings.

DETAILED DESCRIPTION OF THE DRAWINGS

Figure 1:
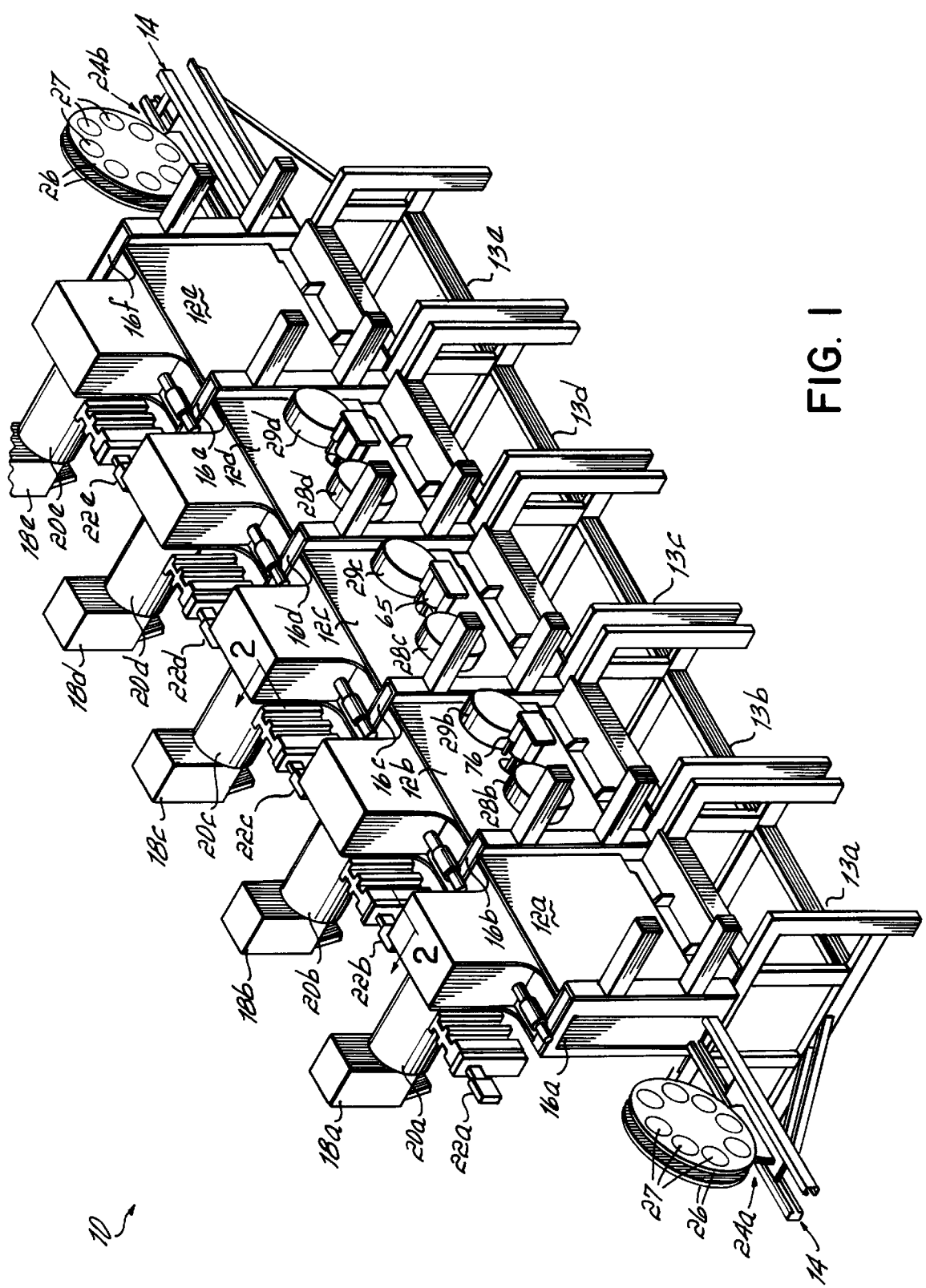
FIG. 1 is a perspective view of a linear transport system for a wafer processing line in accordance with a preferred embodiment of the invention.

FIG. 1 shows a transport system 10 for a wafer processing line. The transport system 10 includes a plurality of housings 12a, 12b, 12c, 12d and 12e which are serially connected. The housings 12a–12e are supported on rigid frames 13a–13e, respectively. A track 14 extends along and through the serially connected housings 12a–12e. Though not shown in FIG. 1, the track 14 comprises a plurality of track segments 14a, 14b, 14c, 14d and 14e which correspond to housings 12a, 12b, 12c 12d and 12e, respectively.

Isolation valves 16 separate and isolate each of the adjacently situated housings 12. The isolation valves 16 open and close to permit and restrict, respectively, access between adjacently situated housings 12 along the track 14. In FIG. 1, isolation valve 16b is located between housings 12a and 12b. Similarly, isolation valve 16c is located between housings 12b and 12c. While FIG. 1 shows six isolation valves, designated by reference numerals 16a–16f, with one isolation valve 16 between every two adjacently situated housings 12, it is to be understood that one or more of these isolation valves 16 could be omitted at the entry and exit ends of any one or more of the housings 12, depending upon the vacuum conditions required for wafer processing. It is to be understood that additional housings 12 may be connected in series. The total number of housings 12 will depend upon the particular wafer process that is being performed. The transport system 10 of this invention is advantageous with respect to a wafer processing line which includes as few as one housing 12 and up to twelve or more housings 12.

Preferably, each of the housings is evacuatable. FIG. 1 shows vacuum pumps 18a–18e connected to housings 12a–12e via conduits 20a–20e, respectively. The vacuum pumps 18a–18e may be isolated from the housings 12a–12e by gate valves 22a–22e, respectively.

At least one wafer carrier 24 is linearly translatable along the track 14 through the housings 12 when the isolation valves 16 are open. FIG. 1 shows a carrier 24a located adjacent the entrance to housing 12a and a second carrier 24b located adjacent the exit of housing 12e. Each wafer carrier 24 includes a pair of spaced, parallel and vertically oriented support members, or pallets 26. The pallets 26 support wafers 27 during wafer processing along the track 14. Preferably, to maximize throughput for a wafer processing operation, a plurality of carriers 24 are synchronously translated in linear fashion through the housings 12 along the track 14. The pressure in each housing 12 is controlled by its corresponding vacuum pump 18, gate value 22 and the two isolation valves 16 located at opposite ends thereof.

In each of the housings 12, a particular wafer processing step is performed. FIG. 1 shows wafer processing units 28b and 29b mounted to one side of housing 12b. Simiarily, wafer processing units 28c and 29b are mounted to one side of housing 12c, and wafer processing units 28d and 29c are mounted to one side of housing 12d. These wafer processing units 28 and 29 may be adapted for performing cathode sputtering, sputter etching, heating or any one of a number of other wafer processing steps.

Figure 2:
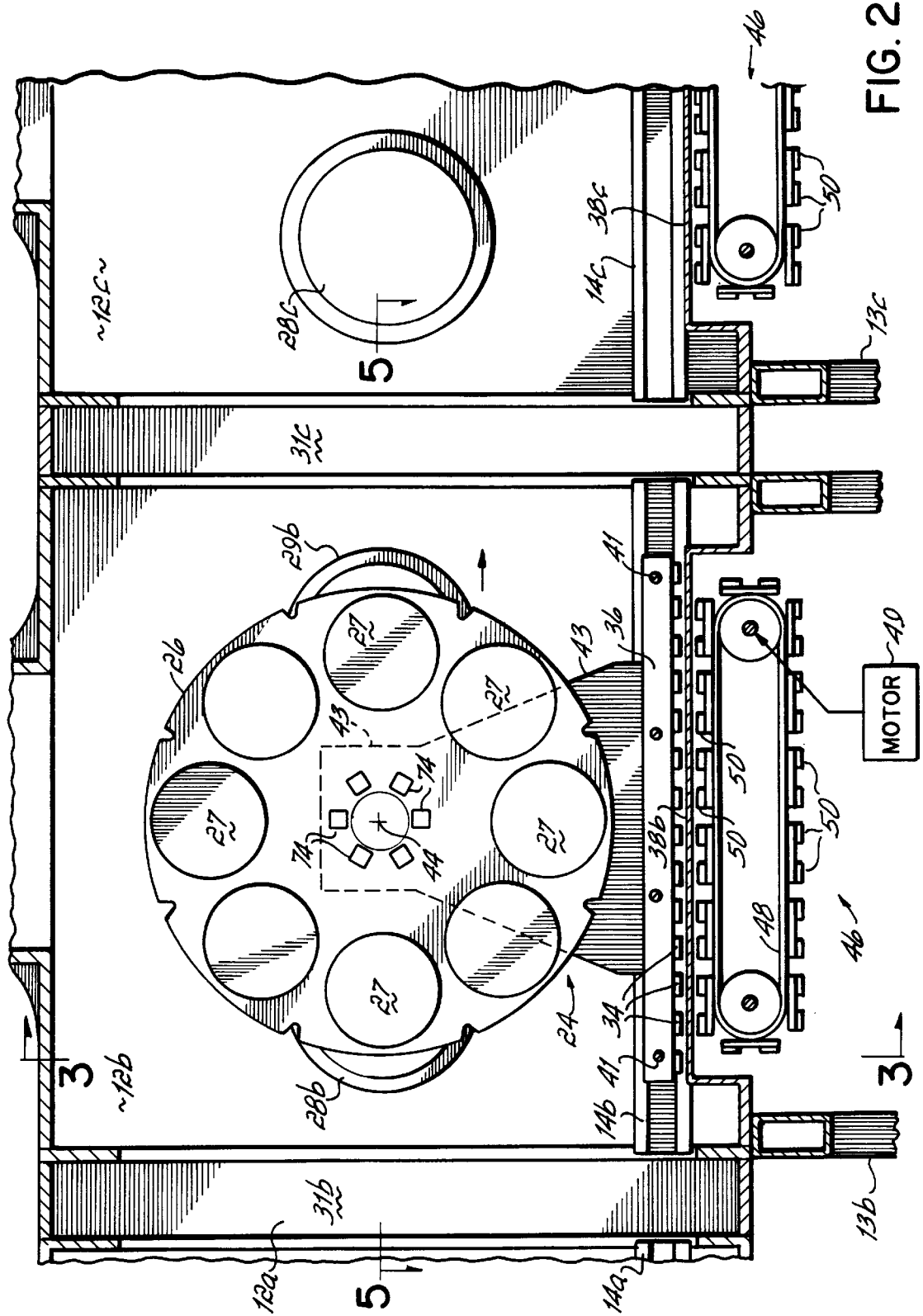
FIG. 2 is a cross-sectional side view taken along lines 2—2 of FIG. 1.

FIG. 2 shows a cross sectional side view of serially connected housings 12b and 12c. Track segments 14b and 14c are located within the housings 12b and 12c, respectively. A space 31 is located between each of the housings 12. More specifically, 31c space is located between interconnected housings 12b and 12c. This space 31c is occupied by isolation valve 16c when the valve 16c is closed to isolate the housings 12b and 12c from each other. The cross sectional dimensions of this space 31c are slightly greater than the cross sectional dimension of the wafer carrier 24. When the isolation valve 16c is open, the space 31c is empty and the carrier 24 may move through space 31c along the track 14 from housing 12b to housing 12c.

Figure 3:
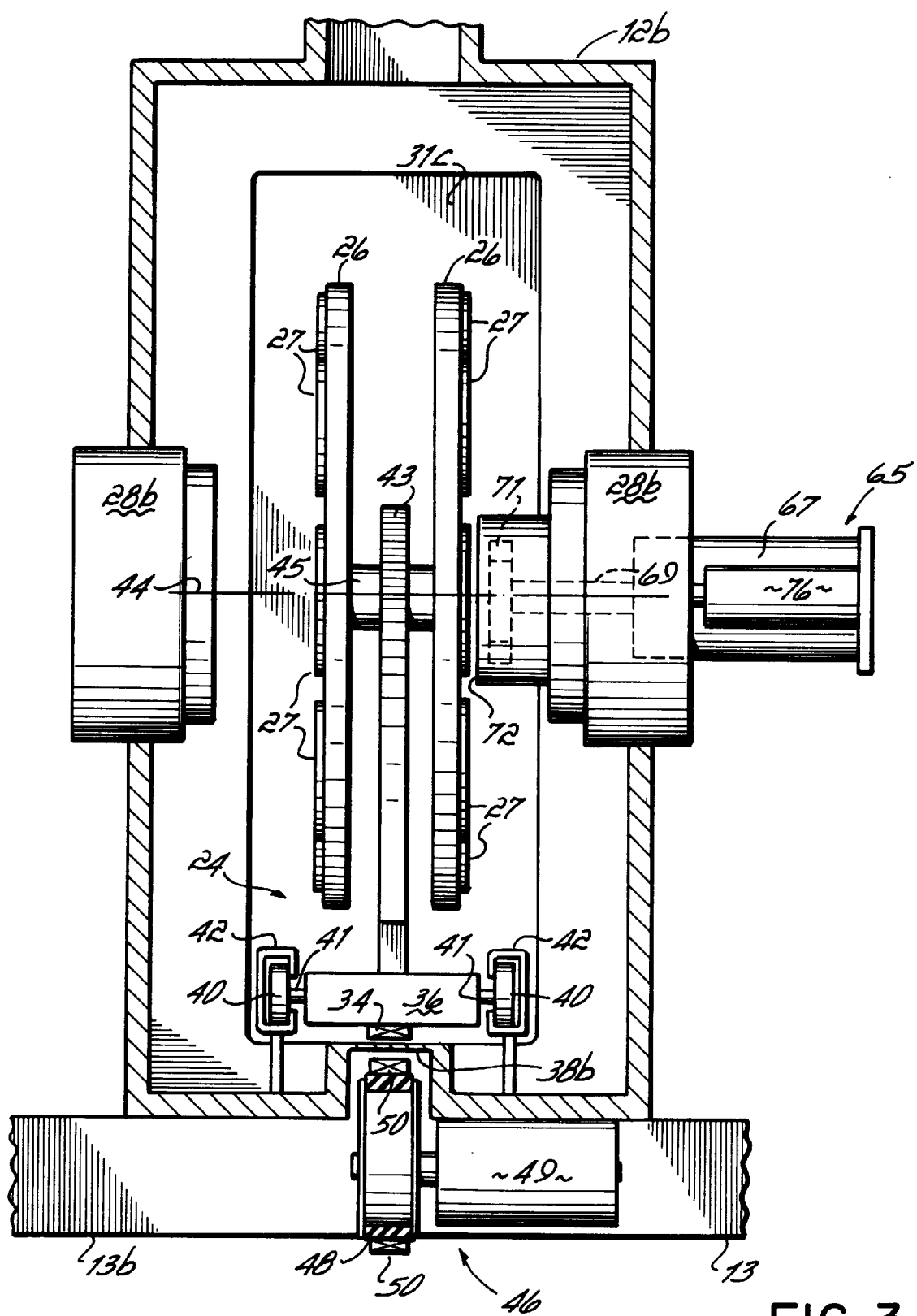
FIG. 3 is a cross sectional front view taken along lines 3—3 of FIG. 2.

To move the wafer carrier 24 through housing 12b, through space 31c and into housing 12c, and along the track 14 between the other interconnected housings 12, the carrier 24 is equipped with a plurality of magnets 34. The magnets 34 are aligned substantially parallel with track segment 14b and mounted to the bottom of a base 36 of the wafer carrier 24. As shown in FIG. 3, the base 36 is supported above a nonmagnetic bottom wall 38b of housing 12b by wheels 40 located on opposite sides of the carrier 24. The wheels 40 rotate on axles 41 which extend outwardly from opposite sides of the base 36. The wheels 40 ride on the bottom surfaces of C-shaped channels 42. The tops of the channels 42 are spaced above the tops of the wheels 40. Preferably, four equidistantly spaced sets of wheels 40 are provided for each carrier 24, though three sets or even five sets or more would also be suitable.

With four spaced sets of wheels 40, the center of gravity of the carrier 24 remains above a center axis 44 through the vertical pallet 26. The carrier 24 also includes a central support member 43 which rotatably supports the pallets 26 on an axle 45. Because of the weight distribution of the carrier 24 and the four sets of wheels 40, the carrier 24 cannot tip forwardly or rearwardly as a forward set of the wheels 40 extends into the space 31c between track segments 14b and 14c.

Additionally, tops of the C-shaped channels 42 will prevent forward or rearward tilting of the carrier 24 as it moves across the discontinuity in the track 14 between the adjacently situated housings 12.

To linearly translate the carrier 24 along the track 14, the transport system 10 includes a plurality of magnetic drive units 46, with one magnetic drive unit 46 corresponding to each of the housings 12. According to one embodiment, the magnetic drive unit 46 includes an endless loop conveyor 48 driven by a motor 49 with a plurality of magnets 50 mounted to the outside of the conveyer 48. For each of the housings 12, a magnetic drive unit 46 is located outside of the housing 12, and the conveyor 48 is aligned parallel with the respective track segment 14. As shown in FIG. 3, the magnets 50 mounted on the conveyor 48 are aligned with the magnets 34 mounted on the carrier 24, with the nonmagnetic bottom wall 38 of the housing 12 located therebetween. The magnets 50 impose a plurality of magnetic fields within the housing 12. Preferably, the thickness of the wall 38 is about ¼ inch and the distances from the magnets 34 to wall 38 and the magnets 50 to the wall 38 are both about ⅛ inch.

When the motor 49 drives the conveyer 48, the magnetic fields imposed in the housing 12 move linearly along the track 14. Because of the magnetic coupling between the magnetic fields from the magnets 50 of the magnetic drive unit 46 and the magnets 34 on the carrier 24, movement of the conveyer 48 causes carrier 24 to move along the track 14. Because this transport system 10 uses no intermeshed gears or frictional couplings or connections, the carriers 24 are linearly translated in an environment which is, for all practical purposes, particulate free. While there is some mechanical contact between the wheels 40 and the C-shaped channels 42, the wheels 40 are substantially surrounded by the channels 42 and located below the wafer holding pallet 26. Finally, because the wafers 27 are mounted to pallet 26 in vertical orientation, the possibility of any particulate settling on wafers during processing is further minimized.

Alternatively, the carrier 24 could be translated along the track 14 via magnetic levitation by permanent magnets or electromagnets mounted inside the housings 12.

While the embodiment shown in FIGS. 2 and 3 involves a magnetic drive unit 46 which employs an endless belt conveyer 48, it is to be understood that the invention contemplates various alternative embodiments for imposing a plurality of magnetic fields within the housings 12 and moving the imposed magnetic fields with respect to the housing 12 for the purpose of linearly translating the carrier 24 along the track 14 therethrough. For instance, the magnets 50 could be moved by a rack and pinion mechanism, or by a nut and screw arrangement with a long screw rotated by a motor to drive the nut linearly.

Figure 4:
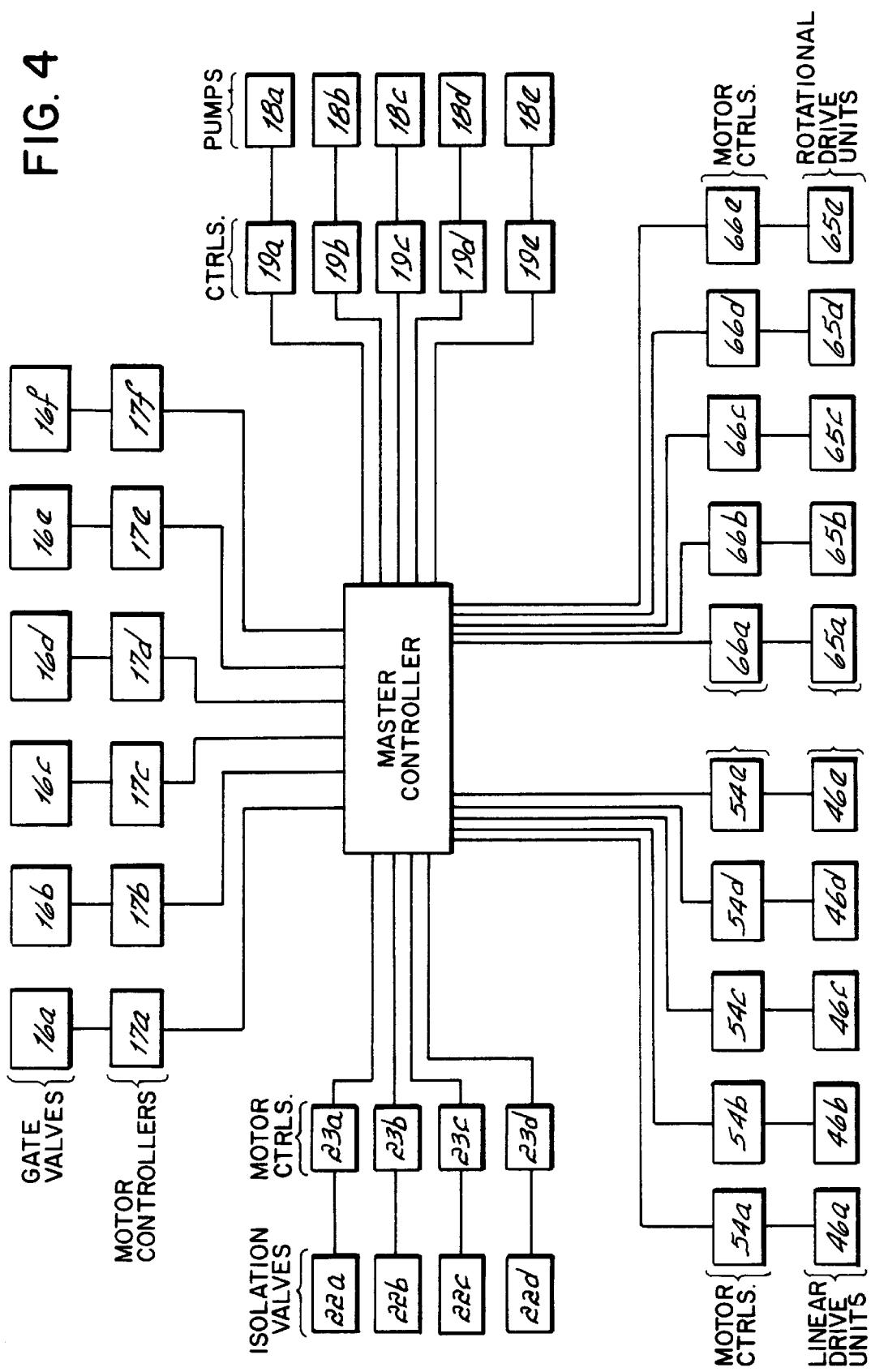
FIG. 4 is a schematic which illustrates the interconnections of a master controller to each of the moveable parts of the transport mechanism depicted in FIG. 1.

As shown schematically in FIG. 4, a master, programmable controller 52 coordinates movement of all of the moveable parts of the transport system 10 of this invention. Preferably, the controller 52 is a microprocessor or a PLC device. The controller 52 operatively connects to a plurality of motor controllers 54, each of which controls the operation of a motor 49 of one of the magnetic drive units 46. The controller 52 also connects to motor controllers 17a–17f which operate isolation valves 16a–16f, respectively. The controller 52 also connects to controllers 19a–19e which operate vacuum pumps 18a–18e, respectively, and motor controllers 23a–23e which operate gate valves 22a–22e, respectively.

The controller 52 coordinates operation of all of these components according to a desired sequence. A plurality of carriers 24 may be moved along the track 14 and through the housings 12 in synchronous fashion, or independently, depending upon the total number of wafers 27 which must be processed along the line according to a particular sequence of steps.

Figure 5:
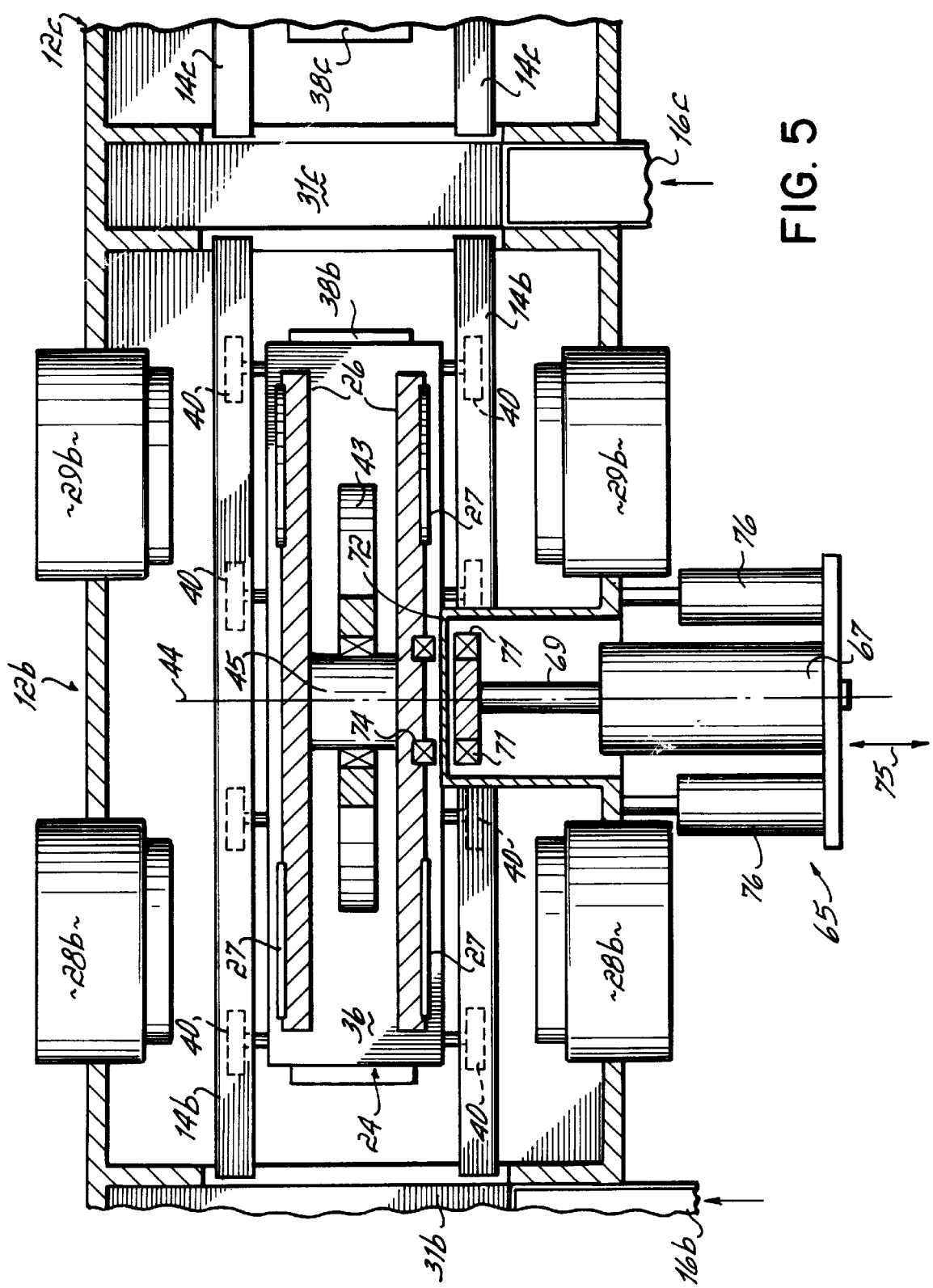
FIG. 5 is a cross-sectional top view taken along lines 5—5 of FIG. 2.

As shown in FIG. 5, the transport system 10 of this invention also contemplates rotation of the pallets 26 during certain wafer processing steps, such as sputter coating or sputter etching. By rotating the pallets 26 during processing, uniformity in wafer coating is achieved. Rotation of the pallets 26 during processing may be continuous, or it may be performed stepwise by indexing the pallet 26 into alignment with the wafer processing units 28 and 29. In certain types of wafer processing, stepwise indexing of the pallets 26 is advantageous. For instance, during sputtering, indexing the pallets 26 to align the wafers 27 with the wafer processing units 28 and 29 reduces the amount of sputtered material which deposits on the side surfaces of the pallet 26, rather than on the wafers 27. Eventually, this material which deposits upon the pallets 26 instead of the wafers 27 must be cleaned off, resulting in down time for the system 10.

FIG. 5 shows the structural components which perform pallet rotation. More particularly, a rotational magnetic drive unit 65 is located outside of housing 12. This rotational drive unit 65 is aligned along the axis 44 of the pallet 26 when the carrier 24 is in a processing position within the housing 12. The drive unit 65 includes a motor 67, a shaft 69 and magnets 71 mounted to a forward end of the shaft 69. The magnets 71 are located proximate an outer surface of a nonmagnetic vertical wall 72 of the housing 12. The pallet 26 also includes magnets 74 mounted proximate the interior surface of the wall 72.

Preferably, the wall 72 is about ¼ inch thick, and the distances between magnets 71 and wall 72 and magnets 72 and wall 72 are both about ⅛ inch. To vary the strength of the magnetic fields imposed by the magnets 71, the magnetic drive unit 65 is moveable along axis 44 toward and away from the housing 12, as shown by directional arrows 75. Pistons 76 located between the two wafer processing units 28 and 29 may be used to move the magnetic drive unit 65 toward and away from housing 12 along axis 44.

During processing, the rotational magnetic drive unit 65 is located in its forward position, as shown in FIG. 5, and magnetic fields imposed in the housing 12 by the magnets 71 magnetically couple with the magnets 74 of the carrier 24. Operation of the motor 67 rotates the shaft 69 to rotate the magnets 71, thereby rotating the imposed magnetic fields. Rotation of the imposed magnetic fields rotates the magnets 74, thereby causing the pallets 26 to rotate. Thus, by controlling operation of the motor 67 to rotate the shaft 69, either continuously or in indexing fashion, the pallets 26 can also be rotated. This moves the wafers 27 relative to the wafer processing units 28 and 29 during processing.

Although only one rotational magnetic drive unit 65 is depicted in the drawings, it is to be understood that additional such drive units 65 may be utilized in this transport system 10, with as many as one unit 65 for each of the housings 12. The total number of rotational drive units 65 will depend upon the number of housings 12 which are dedicated to wafer processing steps that require rotation of the pallet 26 to move wafers 27 relative to the wafer processing units 28 and 29. As with the linear magnetic drive units 46, the vacuum pumps 18, the isolation valves 16 and the gate valves 22, the rotational magnetic drive units 65 and the pistons 76 are preferably connected to the master controller 42 so that rotation of the pallets 26 is coordinated with the movement of the carriers 24 and the isolation of the housings 12, according to a pre-determined sequence of operation.

While these and other features of a transport system 10 in accordance with a preferred embodiment of the invention have been described, it is to be understood that the invention is not limited thereby and in light of the present disclosure, various other alternative embodiments will be apparent to one of ordinary skill in the art without departing from the scope of the invention. Accordingly, applicant intends to be bound only by the following claims.

We claim:

1. A transport system for wafer processing comprising:
    a plurality of housings connected in series to define a wafer processing line;
    a track extending through the housings along the processing line;
    a plurality of isolation valves, each isolation valve located between two adjacently situated housings and operable to open and close to permit and to prevent, respectively, access between adjacently situated housings along the track, the isolation valves also operable to isolate any housing from a housing located adjacent thereto, and the isolation valves dividing the track into a plurality of discontinuous track segments, with one track segment per housing;
    a wafer carrier mounted on wheels which engage the track, thereby making the carrier movable along the track through the housings at a predetermined vertical position above the track, the carrier adapted to hold a plurality of wafers;
    a plurality of carrier magnets attached to the carrier and oriented along the length thereof and substantially parallel with the track;
    a plurality of magnetic drive units located outside of the housings and arranged substantially parallel with the track, each unit associated with one of the housings and the track segment associated therewith, and including means for imposing at least one magnetic field within the respective housing to magnetically couple with the carrier magnets when the carrier is located therein, each unit being operable to move the imposed magnetic fields along the track to magnetically translate the carrier through the respective housing along the respective track segment via the wheels, so that the carrier moves on the wheels through each housing without a mechanical coupling between the respective drive unit located outside the housing and the carrier located inside the housing; and
    a controller operatively connected to the isolation valves and the magnetic drive units to open and close the valves and to move the imposed magnetic fields to translate the carrier along the wafer processing line according to a predetermined sequence, the wafer carrier remaining at the predetermined vertical position during translation and when at rest in the housings.

2. The transport system of claim 1 and further comprising:
    a plurality of said wafer carriers; and
    the controller adapted to synchronously open and close the isolation valves and move the imposed magnetic fields to sequentially translate the carriers along the track while maintaining vacuum conditions within the housings.

3. The transport system of claim 1 wherein the housings have a uniform dimension as measured along the track and the dimension of the carrier as measured along the track is less than said uniform dimension.

4. The transport system of claim 3 wherein each magnetic drive unit has a dimension along the track which is slightly less than said uniform dimension, the carrier dimension being sufficient to span between two drive units when passing through an open isolation valve located between adjacently situated housings associated with said two drive units.

5. The transport system of claim 1 wherein each magnetic drive unit further comprises:
    a plurality of magnets mounted on an endless conveyor oriented parallel with the track, the conveyor dimension as measured along the track being less than the dimension of the respective housing as measured along the track, the conveyor operatively connected to the controller.

6. The transport system of claim 1 wherein the controller is programmable to permit selective variation of the predetermined sequence.

7. The transport system of claim 1 and further comprising:
    a plurality of vacuum pumps, each vacuum pump associated with one of the housings and adapted to maintain vacuum conditions therein, each vacuum pump being operatively connected to the controller; and
    a plurality of gate valves, each gate valve associated with a vacuum pump to isolate the pump from a respective housing, each gate valve operatively connected to the controller, whereby the controller maintains vacuum conditions in the housing during movement of wafers therethrough.

8. The transfer system of claim 1 and further comprising:
    a plurality of wafer processing means, each wafer processing means associated with one of said housings and adapted to perform a wafer processing step upon the wafers held on a carrier when said carrier is located in the respective housing, each wafer processing means operatively connected to the controller.

9. The transport system of claim 8 wherein at least one of said wafer processing means performs a sputtering operation.

10. The transport system of claim 1 wherein the wafers are held on the carrier in vertical orientation.

11. The transport system of claim 10 and further comprising:
    wafer processing means associated with at least one of housings, the wafer processing means located on opposite sides of the track in said at least one housing and adapted to perform a wafer processing operation on surfaces of wafers facing outwardly from the track.

12. The transport system of claim 11 wherein said wafer processing means performs a sputter coating operation.

13. The transport system of claim 11 wherein the wafer carrier further comprises:
at least one planar member rotatably mounted on the carrier and oriented vertically and parallel with the track, the at least one planar member having sides facing outwardly from the track in a substantially perpendicular direction, each said side adapted to hold a plurality of wafers in vertical orientation.

14. The transport system of claim 13 and further comprising:
a carrier magnet mounted on the planar member; and
a rotational magnetic drive unit located outside of at least one of the housings, the rotational drive unit adapted to impose and rotate at least one magnetic field within the housing, thereby to magnetically couple the at least one imposed magnetic field with the carrier magnet to rotate the at least one planar member on the carrier during wafer processing in the housing.

15. The transport system of claim 1 wherein the magnetic drive units are located below the track.

16. A transport system for a sputter coating line comprising:
a plurality of housings connected in series to define a wafer processing line, at least one of the housings including means for sputter coating;
means for evacuating a selected number of said housings, each of said selected number of housings including a gate valve to isolate the respective housing from the evacuating means;
a track extending through the housings;
a plurality of isolation valves, with one said isolation valve located between every two adjacently situated housings and adapted to open and to close to permit and to prevent, respectively, access therebetween along the track, the isolation valves also operable to isolate any housing from a housing located adjacent thereto, and the isolation valves dividing the track into a plurality of discontinuous track segments, with one track segment per housing;
at least one wafer carrier mounted on wheels which engage the track, the carrier movable on the track through the housings along the processing line and at a predetermined vertical elevation, above the track, the wafer carrier adapted to hold a plurality of wafers in vertical orientation;
a plurality of carrier magnets mounted along the length of the carrier and substantially parallel with the track;
a plurality of magnetic drive units located substantially parallel with the track, each drive unit associated with one of the housings and the track segment associated therewith, each unit including means for imposing a plurality of magnetic fields within the respective housing and moving the imposed magnetic fields in a linear direction along the respective track segment, thereby to magnetically couple the imposed fields with the carrier magnets when the wafer carrier is located in the respective housing and to magnetically translate said wafer carrier along the respective track segment via the wheels, so that the carrier moves on the wheels through each housing without a mechanical coupling between the respective drive unit located outside the housing and the carrier located inside the housing; and
a controller operatively connected to the evacuating means, each of the gate valves, each of the isolation valves, each of the magnetic drive units and the sputter coating means to maintain vacuum conditions in the housings, to move the wafer carrier along the track segments and to sputter coat wafers mounted on the carriers according to a predetermined sequence, the wafer carrier remaining at the predetermined vertical elevation during magnetic translation thereof and while at rest.

17. The transport system of claim 16 wherein each magnetic drive unit further comprises:
an endless belt conveyor with a plurality of magnets mounted thereon; and
a motor for driving the conveyor, said motor operatively connected to the controller.

18. The transport system of claim 16 wherein the wafer carrier further comprises:
at least one planar member rotatably mounted on the carrier and oriented vertically and parallel with the track, the at least one planar member having sides facing outwardly from the track in a substantially perpendicular direction, each said side adapted to hold a plurality of wafers in vertical orientation.

19. The transport system of claim 18 and further comprising:
a carrier magnet mounted on the planar member; and
a rotational magnetic drive unit located outside of at least one of the housings, the rotational drive unit adapted to impose and rotate at least one magnetic field within the housing, thereby to magnetically couple the at least one imposed magnetic field with the carrier magnet to rotate the at least one planar member of the carrier during wafer processing in the housing.

20. A wafer processing module comprising:
a housing connectable with other housings to form an in-line wafer processing line, the housing defined by walls;
a track extending through the housing;
a pair of isolation valves located on opposite sides of the housing and along the track, the isolation valves selectively operable to isolate the housing from said other housings;
a wafer carrier mounted on wheels contacting the track and being movable along the in-line wafer processing line through the housings at a predetermined vertical position above the track;
a rotatable pallet mounted on the wafer carrier and adapted to hold a plurality of wafers in a substantially vertical orientation;
a plurality of carrier magnets mounted on the pallet with respect to an axis of rotation of the pallet;
a wafer processor mounted to the housing for processing the wafers supported on the rotatable pallet carried by the wafer carrier when the respective wheels of the wafer carrier engage the track within the housing; and
a rotational magnetic drive unit located outside the housing for imposing at least one magnetic field through one of the walls and into the housing to magnetically couple with the carrier magnets when the carrier is located therein, and further rotating said imposed field to magnetically rotate the pallet on the carrier during wafer processing in the housing, so that the pallet rotates without a mechanical coupling between the magnetic drive unit located outside the housing and the pallet located inside the housing.

21. The transport system of claim 20 and further comprising:

means for moving the magnetic rotational drive unit toward and away from the housing to control the magnitude of the at least one magnetic field imposed in the housing.

22. The transport system of claim 20 and further comprising:

means for rotating the pallet in a continuous manner.

23. The transport system of claim 20 and further comprising:

means for rotating the pallet in an indexed manner.

* * * * *